United States Patent [19]
Lundy et al.

[11] Patent Number: 6,054,252
[45] Date of Patent: Apr. 25, 2000

[54] PHOTOIMAGEABLE COMPOSITIONS HAVING IMPROVED CHEMICAL RESISTANCE AND STRIPPING ABILITY

[75] Inventors: Daniel E. Lundy, Pomona; Robert K. Barr; Edward J. Reardon, both of Laguna Niguel, all of Calif.

[73] Assignee: Morton International, Inc., Chicago, Ill.

[21] Appl. No.: 09/364,494

[22] Filed: Jul. 30, 1999

Related U.S. Application Data

[63] Continuation-in-part of application No. 09/209,724, Dec. 11, 1998.

[51] Int. Cl.[7] .......................... G03C 1/73; C08F 267/04; C08K 5/10
[52] U.S. Cl. .................... 430/285.1; 430/287.1; 525/285; 522/120; 522/123
[58] Field of Search .............. 430/285.1, 287.1, 430/280.1; 522/113, 114, 120, 123, 150; 525/285

[56] References Cited

U.S. PATENT DOCUMENTS

| | | | |
|---|---|---|---|
| 3,448,089 | 6/1969 | Cleleste | 525/285 |
| 4,537,855 | 8/1985 | Ide | 430/285.1 |
| 4,963,601 | 10/1990 | Shibato et al. | 523/339 |

*Primary Examiner*—Janet Baxter
*Assistant Examiner*—Sin J. Lee
*Attorney, Agent, or Firm*—Steven C. Benjamin; Wayne E. Nacker; Gerald K. White

[57] ABSTRACT

A negative-acting photoimageable composition useful as a primary imaging resist in the manufacture of printed circuit boards comprises an acid-functional binder polymer, a photopolymerizable component, and a photoinitiator chemical system, in which the binder polymer has an anhydride functional backbone half-esterified with a meth(acrylate) functional hydroxy-terminated oligomer, wherein the meth (acrylate) functionality is separated from the half-ester linkage by at least two alkoxylate groups and at least one ring opened lactone group for improved stripping ability in strong alkaline aqueous stripping solutions, while maintaining good chemical resistance to other processing chemicals, such as alkaline developing solutions, acid etching solutions, and acid plating baths.

15 Claims, No Drawings

PHOTOIMAGEABLE COMPOSITIONS HAVING IMPROVED CHEMICAL RESISTANCE AND STRIPPING ABILITY

This is a of continuation-in-part of copending application Ser. No. 09/209,724 filed on Dec. 11, 1998

FIELD OF THE INVENTION

The present invention is directed to negative-acting photoimageable compositions such as those used as photoresists in the art of printed circuitry. The binder polymer of the photoimageable composition is a styrene/maleic anhydride copolymer or other anhydride functional copolymer modified with a (meth)acrylate-functional oligomer for improved chemical resistance and stripping ability.

BACKGROUND OF THE INVENTION

This invention is directed to negative-acting photoimageable compositions which are developable in alkaline aqueous solutions. The invention is particularly applicable to primary photoimaging resists, but is applicable, as well, to compositions that are hardenable so as to form solder masks and the like.

It is well known to use as binders in such photoimageable compositions styrene/maleic anhydride (SMA) copolymers which are esterified with various alcohols, e.g., U.S. Pat. No. 5,609,991, the teachings of which are incorporated herein by reference.

U.S. Pat. No. 5,296,334, the teachings of which are incorporated herein by reference, teaches photoimageable compositions which are esterified with a (meth)acrylate functional alcohol, such as hydroxyethylmethacrylate (HEMA). By adding (meth)acrylate functionality to the binder polymer, the binder polymer, along with acrylate functional monomer enters into the photo-initiated cross-linking reaction, thereby increasing the cross-linked density of the exposed resist.

(Meth)acrylate functional binder polymers, such as those taught in U.S. Pat. No. 5,296,334 have proven valuable in secondary photoimageable compositions, such as those used for forming permanent layers, e.g., solder masks. On the other hand, (meth)acrylate functional binder polymers have proved difficult to incorporate into primary photoimaging resists, which are not designed to be permanent coatings. In particular, the increased cross-link density afforded by the (meth)acrylate functionality significantly interferes with the stripping process of printed circuit board fabrication. In fact, the increased (meth)acrylate functionality combined with the high molecular weight and hydrophobic character of the styrene made stripping almost impossible in aqueous NaOH type stripping solutions. Moreover, the ethylene oxide link in the HEMA type monomers created potential problems with water sensitivity during developing, etching and plating processing steps.

SUMMARY OF THE INVENTION

It is, therefore, a primary object of this invention to provide negative-acting photoimageable compositions which contain a meth(acrylate) functional binder polymer yet do not suffer from the foregoing drawbacks.

Negative-acting photoimageable compositions in accordance with the invention are provided which comprise I) between about 30 wt % and 100%, preferably between about 30 about 80 wt % based on total weight of I) plus II) plus III) of a binder polymer having sufficient acid functionality to render the photoimageable composition developable in alkaline aqueous solution, between 0 and about 70 wt %, preferably at least about 20 wt % based on total weight of I) plus II) plus III) of an addition-polymerizeable, non-gaseous α, β-ethylenically unsaturated compounds) capable of forming a high polymer by free-radical initiated chain-propagating addition polymerization, and III) between about 0.1 and about 20 wt % based on total weight of I) plus II) plus III) of a photoinitiator chemical system.

The improvement is the use in the photoimageable composition of a binder polymer I) which has an anhydride-functional copolymer backbone, preferably a styrene/maleic anhydride copolymer backbone, in which the anhydride residues of the copolymer backbone are half-esterified to at least 10 mol %, preferably at least 25 mol %, up to 100 mol % total of the anhydride residues with a hydroxy-functional oligomer and optional monomers, with at least 5 mol %, preferably at least 25 mol %, up to 100 mol % total being half-esterified with a (meth)acrylate-functional hydroxyl-terminated oligomer having the formula:

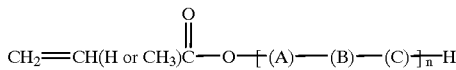

wherein (A), (B) and (C) are in any order, n is an integer from 1 to 40, with n typically being 1, and (A) comprises a chain formed of between about 1 and 40 alkoxylate monomers and/or aromatic-substituted alkoxylate monomers having between about 1 and 20 carbon atoms, (B) is either absent or comprises a chain formed of between about 1 and 40 alkoxylate monomers and/or aromatic-substituted alkoxylate monomers having between about 1 and 20 carbon atoms, the monomer composition of (B) being different than the monomer composition of (A), (A) plus (B) being formed from at least 2, preferably between about 4 and about 12 monomers, and (C) comprises a chain formed of between 1 and 40 lactone or lactam monomers, preferably lactone monomers, having between about 2 and 21 carbon atoms.

The binder polymer has between about 10 and 90 mol %, preferably between about 45 and 50 mol % anhydride residues, a weight average molecular weight of between about 2,000 and 200,000, preferably of between about 25,000 and 55,000, and an acid number of between about 50 and 250, preferably between about 130 and 180.

DETAILED DESCRIPTION OF CERTAIN PREFERRED EMBODIMENTS

Herein, unless otherwise noted, all percentages are weight percentages. Component I) (the binder polymer) and Component II) (the photoimageable compounds(s)) and Component III) (the photoinitiator chemical system) are herein considered to equal 100 wt %, and other components are calculated as parts relative to 100 parts of I) plus II) plus III).

The term "(meth)acrylate" is meant to encompass "acrylate" and "methacrylate" functionality and mixtures thereof.

The currently preferred method of forming the binder polymer component I) of the present invention is to initially copolymerize styrene and maleic anhydride by a conventional free-radical polymerization procedure, to produce what is referred to herein as the anhydride-functional backbone. Styrene and maleic anhydride are known to polymerize in a regular alternating pattern which provides an ordered backbone polymer. While styrene is the preferred comonomer for forming the non-acid portion of the binder polymer backbone, styrene substituted with a $C_1$–$C_6$ alkyl group, such as α-substituted, e.g., 2-methyl styrene, or substituted on an aromatic ring, e.g., vinyl toluene, vinyl ethers, vinyl esters and acrylol esters, such as vinyl acetate or methyl methacrylate, may also be used. While maleic anhydride is the preferred comonomer for forming the anhydride portion of the binder polymer backbone, $C_1$–$C_3$ mono- or dialkyl-substituted and aryl-substituted maleic anhydrides may also be used, such as 2-methyl maleic anhydride, 2-ethyl maleic anhydride, 2-phenyl maleic anhydride and 2,3-dimethyl maleic anhydride, as may other anhydride-functional monomers, such as tetrahydrophthalic anhydride, methyltetrahydrophthalic methylnorbornene-2,3-dicarboxylic anhydride, cis-5-norbornene-endo-2,3-dicarboxylic anhydride, and the like.

It is generally desired to provide the anhydride-functional backbone copolymer with between about 10 and 90 mol %, preferably between about 45 and 50 mol % anhydride residues, preferably maleic anhydride residues, and balance non-acid residues, preferably styrene residues, to provide the desired acid number to the binder polymer upon subsequent half-esterification, to render the photoimageable composition developable in alkaline aqueous solution. In addition, it is desired that the anhydride-functional backbone copolymer have a weight average molecular weight of between about 2,000 and 200,000, preferably of between about 25,000 and 55,000.

Subsequently, the anhydride-functional copolymer backbone is half-esterified with what is referred to herein as the (meth)acrylate-functional hydroxyl-terminated oligomer.

While in the above described formula for the (meth)acrylate-functional, hydroxyl-terminated oligomer, (A), (B) if present, and (C) may theoretically be in any order, the preferred mode of oligomer synthesis generally dictates that (C) be at the terminus opposite the (meth)acrylate functionality. In the preferred synthetic route, (meth)acrylic acid is reacted with an alkoxylate monomer or aromatic-substituted alkoxylate monomer or a mixture of such monomers so as to produce (A). If desired, further reaction is carried out with an different alkoxylate monomer, aromatic substituted alkoxylate monomer or mixture of such monomers to produce (B). The resulting product is then reacted with a lactone or lactam to produce (C).

Alkoxylate monomers used in forming (A) and (B) of the oligomers include alkoxylate monomers, straight chain or branched, having from 1 to 20 carbon atoms, although short chain alkoxylates of at least 2 carbon atoms, such as ethylene oxide, propylene oxide, butylene oxide and tetrahydrofuran, are generally preferred. Also, aromatic-substituted alkoxylates, such as styrene oxide may be used to form (A) and (B). While (B), if present, is herein defined as is (A), (B) is formed from a different monomer from (A). For example (A) could be formed from ethylene oxide and (B) could be formed from propylene oxide, or (A) could be formed from a mixture of ethylene oxide and tetrahydrofuran while (B) could be formed from a mixture of propylene oxide and styrene oxide. The optional incorporation of (B) allows the oligomer to be tailored to particular applications. To provide sufficient chain length to the oligomer, (A) plus (B) must be formed from at least 2 monomers total, preferably between 4 and 12 monomers.

Component (C) of the oligomer is formed from 1 to 40 lactone monomer units, either a single lactone species or mixture of lactone species. The lactone species may be linear or branched, and generally has from 2 to 21 carbon atoms, although 6 carbon atoms are generally preferred. Epsilon-caprolactone is the preferred lactone for forming (C). Other suitable lactones include, but are not limited to, beta-butyrolactone, zeta-enantholactone, delta-valerolactone. Also, $C_1$–$C_6$ alkyl-substituted lactones, such as the alkyl delta-valerolactones, such as methyl-, ethyl-, hexyl-, dimethyl-, diethyl-, di-n-propyl-, di-n-hexyl-, di-isopropyl-, trimethyl-, triethyl-, and tri-n-propyl-epsilon caprolactones, as well as $C_1$–$C_6$ alkoxy- and aromatic-substituted lactones may also be used. In addition to lactones, lactams may be substituted for forming component (C). Suitable lactams include those which correspond to the lactones listed above, with epsilon-caprolactam being especially preferred.

The oligomer is hydroxy-terminated at the terminus opposite the (meth)acrylate functionality, and the terminal hydroxy functionality readily reacts with the anhydride residues, preferably the maleic anhydride residues, of the anhydride-functional backbone polymer, preferably of the styrene/maleic anhydride backbone polymer, to form the half ester. All or just a portion of the esterifying species may be the above-described oligomer, depending upon the amount of (meth)acrylate functionality desired. Generally, it is desired to esterify a substantial proportion of the anhydride groups. If for a particular application the oligomer is used to esterify only a portion of the anhydride groups, an additional alcohol, such as methanol, ethanol, propanol, etc. may be used to esterify additional maleic anhydride groups. Total half-esterification must generally be at least about 10% of the anhydride moieties, preferably at least about 25%, and most preferably 100% or as close to 100% as can be reasonably achieved. At least 5 mol %, preferably at least 25 mol %, up to 100 mol % of the half-esterification should be with the above-described oligomer.

The half-esterification process provides a carboxylic acid group for each half ester. The degree of acid functionality is, therefore, generally determined by the molar ratio of non-acid monomer, e.g., styrene, and the anhydride-functional monomer, e.g., maleic anhydride, used in forming the backbone polymer. The carboxylic acid is sufficient to render the binder polymer soluble in alkaline aqueous developing solutions. The binder polymers in accordance with the invention generally have acid numbers between about 50 and 250, preferably between about 130 and 180.

Through use of the above-described (meth)acrylate-functional hydroxyl-terminated oligomers whereby the chain which links the (meth)acrylate functionality to the preferred styrene/maleic anhydride backbone is extended with at least two alkoxylate groups and a ring opened lactone or lactam group, improved stripping is achieved while maintaining good chemical resistance during developing, etching and plating steps. By distancing the (meth)acrylate functionality from the polymer backbone the ester links present in the ring opened lactone or lactam portion (C) provide sites for hydroxide attack during the stripping operation, thereby greatly shortening stripping time. While producing sites for stripping solution attack, the relatively hydrophobic chain extension provides good chemical resistance to acid plating baths and acid etching solutions.

Furthermore, the chain extension to the styrene/maleic anhydride backbone improves three other properties: 1) coldflow / roll formation, 2) flexibility of the cross-linked system, and 3) photo reactivity. The coldflow improvement is achieved by the higher molecular weight of the system. The flexibility is achieved by incorporation of a long linear chain attached to the cross-linkable (meth)acrylate functionality. The improved photo reactivity over resins in which HEMA is directly linked to the styrene/maleic anhydride backbone is possible due to the longer chain length of the additional monomers that help to minimize the steric hinderance of the (meth)acrylic groups of the side chain with the SMA polymer matrix.

Typical photoresists of this general type contain photoimageable monomers and/or oligomers. Because the polymers of the present invention have (meth)acrylate functionality, it is possible in some cases to rely entirely on the (meth)acrylate functionality of the resin for photoimaging in accordance with a suitable photoinitiator chemical system. However, for suitable cross-link density and sufficiently short exposure times, most photoimageable compositions in conjunction with the present invention contain monomers and/or oligomers. The photopolymerizeable component II), if present, is typically a monomer, dimer or short chain oligomer having ethylenic unsaturation, particularly, α, β-ethylenic unsaturation, including mono-functional compounds and compounds having α, β-ethylenic unsaturation functionality 2 or greater. Typically, a mixture of mono-functional and multi-functional monomers will be used. Examples of monomers suitable for photoinitiatiated polymerization include, but are not limited to, acrylic acid, methacrylic acid, maleic acid, fumaric acid, citraconic acid, 2-acrylamido-2-methylpropanesulfonic acid, 2-hydroxyethyl acrylolyl phosphate, 2-hydroxypropyl acrylol phosphate, 2-hydroxy-alpha-acryloyl phosphate, methyl acrylate, 2-ethyl hexyl acrylate, n-butyl acrylate, n-hexyl acrylate, methyl methacrylate, hydroxy ethyl acrylate, butyl methacrylate, octyl acrylate, 2-ethoxy ethyl methacrylate, t-butyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4benzenediol dimethacrylate; styrene and alkyl- and aromatic-substituted styrenes, such as 2-methyl styrene and vinyl toluene, and vinyl esters, such as vinyl acrylate and vinyl methacrylate, although the non-acid functional monomers are preferred. Also useful are (meth)acrylate terminated urethane oligomers prepared from hydroxy functional mono(meth) acrylates such as those described in U.S. Pat. No. 5,744,282. Particularly useful are urethane oligomers prepared from hydroxy functional polyalkoxylatepolylactone mono(meth) acrylates such as those described herein and further set forth in U.S. Patent Application of Lundy, Barr and Reardon, entitled "Photoimageable Compositions Having Improved Flexibilty and Stripping Ability", filed the same day herewith, the teachings of which are incorporated herein by reference.

To initiate polymerization of the monomers upon exposure to actinic radiation, the photoimageable composition contains a photoinitiator chemical system. Generally, the photoinitiator chemical system comprises between about 0.1 and about 20 wt % based on total weight of I) plus II) plus III). Chemicals suitable in photoinitiator chemicals systems include, but are not limited to 9-phenylacridine, n-phenylglycine, aromatic ketones (e.g., benzophenone, N, N' -tetramethyl-4, 4' -diaminobenzophenone [Michler's ketone], N,N'-tetraethyl-4,4'-diaminobenzophenone,4-methoxy-4'-dimethylaminobenzophenone, 3,3'-dimethyl-4-methoxybenzophenone, p,p'-bis(dimethylamino) benzophenone, p,p'-bis(diethylamino)-benzophenone, anthraquinone, 2-ethylanthraquinone, naphthaquinone, phenanthraquinone, benzoins (e.g., benzoin, benzoinmethylether, benzoinethylether, benzoinisopropylether, benzoin-n-butylether, benzoin-phenylether, methylbenzoin, ethybenzoin, etc.), benzyl derivatives (e.g., dibenzyl, benzyldiphenyldisulfide, ben-zyldimethylketal (SIC), etc.), acridine derivatives (9-phenylacridine, 1,7-bis(9-acridinyl)heptane, etc.), thioxanthones (2-chlorothioxanthone, 2-methylthioxanthone, 2,4-diethylthioxanthone, 2,4-dimethylthioxanthone, 2-isopropylthioxanthone, etc.), acetophenones (e.g., 1,1-dichloroacetophenone, p-t-butyldichloro-acetophenone, 2,2-diethoxyacetophenone, 2,2-dimethoxy-2-phenylacetophenone, 2,2-dichloro-4-phenoxyacetophenone, etc.), 2,4,5-triarylimidazole dimers (e.g., 2-(o-chlorophenyl)-4,5-diphenylimidazole dimer, 2-(o-chlorophenyl)-4,5-di(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, etc.) etc. Though, not a free-radical generator, triphenylphosphine may be included in the photoinitiator chemical system as a catalyst.

The photoimageable composition may advantageously include one or more plasticizers at between about 0.5 and about 10 wt % based on total weight of I) plus II) plus III). Examples of suitable plasticizers include, but are not limited to, phthalate esters (e.g., dibutylphthalate, diheptylphthalate, dioctylphthalate, diallylphthalate), glycols (e.g., polyethylene-glycol, polypropyleneglycol), glycol esters (e.g., triethylene-glycoldiacetate, tetraethyleneglycoldiacetate, dipropyleneglycol-dibenzoate), phosphate esters (tricresylphosphate, triphenylphosphate), amides (p-toluenesulfoneamide, benzenesulfoneamide, N-n-butylacetoneamide), aliphatic dibasic acid esters (diisobutyl-adipate, dioctyladipate, dimethylsebacate, dioctylazelate, dibutylmalate, triethylcitrate, tributylcitrate, triethylacetylcitrate, tri-n-propylacetylcitrate, tri-n-butylacetylcitrate, butyl-laurate, dioctyl-4,5-diepoxycyclohexane-1, 2-dicarboxylate, glycerinetriacetylesters, dipropyleneglycol dibenzoate, polyethyleneglycol 200 dibenzoate, sucrose benzoate, trioctyl trimellitate, etc.

Compositions of the present invention typically include a color former to provide contrast to the light-exposed photoimageable composition. Color formers are typically used at between about 0.1 and about 1.0 wt % relative to total weight of I) plus II) plus III).

Examples of color formers include, but are not limited to, diphenylamine, dibenzylaniline, triphenylamine, diethylaniline, diphenyl-p-phenylenediamine, p-toluidine, 4,4'-biphenyldiamine, o-chloroaniline, etc., leuco crystal violet; leuco malachite green.

Additionally, the photoimageable compositions may contain a wide variety of additional components as are known in the art, including additional polymers, such as those which might be used to effect a final hardened cure of a solder mask, dyes, stabilizers, flexibilizing agents, fillers etc.

Processing of the photoimageable composition is in a conventional manner. In a typical procedure, a photoimageable composition layer, either formed from a liquid composition or transferred as a layer from a dry film, is applied to a copper surface of a copper-clad board. When a dry film is used, the dry film typically comprises a liquid photoimageable composition dried onto a flexible sheet, e.g., polyethylene terephthalate. A protective sheet, e.g., polyethylene, is usually provided on the surface of the dried photoimageable layer opposite the support sheet before the film is rolled into reels. The protective sheet is removed prior to application, e.g., lamination, to the copper-clad board. Once applied, the photoimageable composition layer is then exposed to actinic radiation through appropriate artwork. Exposure to actinic radiation polymerizes the monomer in the light-exposed areas, resulting in a cross-linked structure that is resistant to developer. Next, the composition is developed in dilute alkaline aqueous solution, such as a 1% sodium carbonate solution. The alkali solution causes salt formation with the carboxylic groups of the binder polymers, rendering them soluble and removable. After development, an etchant may be used to remove copper from those areas where the resist was removed, thereby forming a printed circuit. The remaining resist is then removed using an appropriate stripper, such as 3% sodium hydroxide solution.

The invention provides a fine line (less than 75 microns) resist sidewall which adheres well to copper surfaces.

The invention will now be described in greater detail by way of specific examples.

EXAMPLE 1

Partially Esterified Styrene-Maleic Anhydride Copolymer With Poly(Ethoxylated) Poly (Caprolactone) Block Copolymer Monomethacrylate About 20.0 grams of styrene/maleic anhydride (1.27:1) copolymer (Elf Atochem's SMA1000 Resin, 6,000 Mw) was dissolved in 81.9 grams of acetone in a flask equipped with a mechanical agitator and a reflux condenser, followed by addition of 0.17 grams of MEHQ and 0.17 g of DMAP. After addition, the mixture was heated with agitation to reflux.

About 77.8 grams of poly(ethoxylate-b-caprolactone) monomethacrylate oligomer (850 Mw, 0 acid number) having the formula:

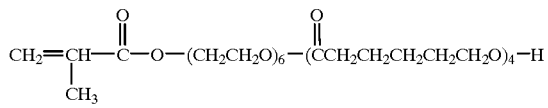

was then added to the mixture while maintaining reflux. The reaction mixture was then kept at reflux for an additional 4 hours. The reaction mixture was then cooled and bottled.

| Polymer | Acid No. | Mw | ½ Esterified |
|---|---|---|---|
| Example 1 | 160 | 16,000 | 30 mole % |

EXAMPLE 2 (Comparative)

Partially Esterified Styrene-Maleic Anhydride Copolymer With Poly(Ethoxylated) Monomethacrylate About grams of styrene/maleic anhydride (1.27:1) copolymer (Elf Atochem's SMA1000 Resin, 6,000 Mw) was dissolved in about 409.8 grams of acetone in a flask equipped with a mechanical agitator and a reflux condenser, followed by the addition of 0.68 grams of MEHQ and 0.3 g of DMAP. After addition, the mixture was heated with agitation to reflux.

About 173.4 grams of poly(ethoxylated) monomethacrylate oligomer (350 Mw, 0 acid number) having the formula:

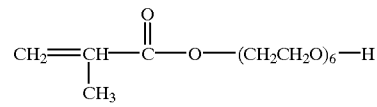

was then added to the mixture while maintaining reflux. The reaction mixture was then kept at reflux for an additional 16 hours. The reaction mixture was then cooled and bottled.

The properties of the binder polymer obtained are given in the Table below.

| Polymer | Acid No. | Mw | Pd | ½ Esterified |
|---|---|---|---|---|
| Example 2 | 170 | 8,600 | 7.8 | 35 mole % |

EXAMPLE 3

Negative-Acting Photoresists

The following ingredients were blended together in the given proportions to provide a negative-acting photoresist composition of the present invention (1) along with a comparative photoresist composition (2).

| | Formulations | |
|---|---|---|
| Ingredient | 1 | 2 |
| Acrylic copolymer binder[1] | 40 | 40 |
| Caprolactone HEMA Functionalized SMA #1[2] | 30 | |
| HEMA Functionalized SMA #2[3] | | 30 |
| bis(dialkylaminophenyl) ketone | .04 | .04 |
| halogenated lophine dimer | 2.7 | 2.7 |
| tris(dialkylaminophenyl) methane | 0.3 | 0.3 |
| aromaticsulfonamide | 3.5 | 3.5 |
| Modifiedacridine | 0.1 | 0.1 |

Table Footnotes
[1]88,000–91,000 Mw copolymer of MMA, MAA, n-BA, Tg 90° C., 150 acid number.
[2]Binder polymer of Example 1.
[3]Binder polymer of Example 2.

Each mixture was prepared at about 55% solids in 2-butanone and coated onto a 0.8 mil polyester carrier film and dried to approximately 1% residual VOC's. A thin film of about 1.5 mils thickness was obtained. The films were then laminated at 121° C., 40 psi, 1 meter per minute, onto chemically cleaned 1 oz. copper/0.059 FR-4/1 oz. clad copper laminate and imaged on a 5 kw printer through a silver halide phototool with an adjusted exposure to obtain a copper step of 9 as measured with a Stouffer® 21 step wedge. The panels were then developed in 1% sodium carbonate monohydrate at 29° C. to remove the photoresist in the unexposed portions, followed by several spray rinses using tap water and the deionized water. The imaged board was then etched in 2N cupric chloride/HCl at 45° C. The etched boards were then stripped of the imaged and developed photoresist in a 3% sodium hydroxide solution at 49° C., followed by a spray rinse of tap water.

Performance test results are given in the Table below.

| Performance Test | Formulations | |
|---|---|---|
| | 1 | 2 |
| Thickness (μm) | 36 μm | 36 μm |
| Break Point[1] (1% Na$_2$CO$_3$.H$_2$O, 49° C.) | 22 sec | 40 sec |
| Sensitivity (mJ) solid step 9 | 100 | 141 |
| Stripping Time[2], step 9 (3% NaOH, 54° C.) | 32 sec | 43 sec |
| Stripping Mode[3], step 9 (3% NaOH, 54° C.) | sheet | small pieces |
| Resolution (step 9, 4x B.P.) | 65 μm | 85 μm |
| Fine Line Adh (step 9, 4x B.P.) | 55 μm | 65 μm |
| SST41 (step 9, 4x B.P.) | 25 | 26 |
| Line Width, 4 mil artwork (step 9, 4x B.P.) | 3.74 mils | 3.15 mils[4] |

Table Footnotes
[1] The breakpoint time was recorded at the point the resist dissolved completely in 1% Na$_2$CO$_3$.H$_2$O at 49° C.
[2] The stripping time was recorded at the point the resist stripped completely in 3% NaOH at 54° C.
[3] The particle size of the stripped resist pieces coming off the board was visually recorded.
[4] The resist was severely attacked by the developing process resulting in chipped edges and overall undersize.

From the foregoing it will be seen that this invention is one well adapted to attain all ends and objects hereinabove set forth together with the other advantages which are apparent and inherent. Since many possible variations may be made of the invention without departing from the scope thereof, the invention is not intended to be limited to the embodiments and examples disclosed, which are considered to be purely exemplary. Accordingly, reference should be made to the appended claims to assess the true spirit and scope of the invention, in which exclusive rights are claimed.

What is claimed is:

1. A negative-acting photoimageable composition, comprising:

I) a binder polymer having sufficient acid functionality to render said photoimageable composition developable in alkaline aqueous solution;

II) either absent or a photopolymerizable material for said binder polymer; and, III) a photoinitiator chemical system, wherein said binder polymer comprises a backbone having between about 10 and 90 mol. % anhydride residues, said anhydride residues being half-esterified to at least about 10 mol % total of said anhydride residues with a hydroxy-functional momomer or oligomer, all or a portion of said half-esterification being with a (meth)acrylate-functional hydroxy-terminated oligomer having the formula:

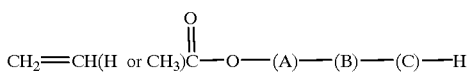

wherein (A), (B) and (C) are in any order, (A) comprises a chain formed of between about 1 and 40, linear or branched. unsubstituted or substituted, alkoxylate monomers having between about 1 and 20 carbon atoms, (B) is either absent or comprises a chain formed of between about 1 and 40, linear or branched, unsubstituted or substituted, alkoxylate monomers having between about 1 and 20 carbon atoms, the monomer composition of (B) being different than the monomer composition of (A), (A) plus (B) being formed from at least 2 monomers, (C) comprises a chain formed of between about 1 and 40, linear or branched, unsubstituted or substituted, lactone monomers having between about 2 and 21 carbon atoms.

2. The photoimageable composition of claim 1, wherein: said binder polymer backbone is formed of monomers comprising maleic anhydride and styrene.

3. The photoimageable composition of claim 1, wherein: said binder polymer has a weight average molecular weight of between about 2,000 and 200,000.

4. The photoimageable composition of claim 1, wherein: said binder polymer has an acid number of between about 50 and 250.

5. The photoimageable composition of claim 1, wherein: at least about 5 mol %, up to about 100% total of said half-esterification being with said (meth)acrylate-functional hydroxyl-terminated oligomer.

6. The photoimageable composition of claim 1, wherein: said (meth)acrylate-functional hydroxyl-terminated oligomer is formed of monomers comprising (meth) acrylic acid, ethylene oxide, and epsilon-caprolactone.

7. A negative-acting photoimageable composition, comprising:

I) between about 30 wt % and 100% based on total weight of I) plus II) plus III) of a binder polymer having sufficient acid functionality to render the photoimageable composition developable in alkaline aqueous solution;

II) between 0 and about 70 wt % based on total weight of I) plus II) plus III) of an addition-polymerizeable, α, β-ethylenically unsaturated compound(s) capable of forming a high polymer by free-radical initiated chain-propagating addition polymerization with said binder polymer I); and, III) between about 0.1 and about 20 wt % based on total weight of I) plus II) plus III) of a photoinitiator chemical system, wherein said binder polymer comprises a backbone having between about 10 and 90 mol. % anhydride residues, said anhydride residues being half-esterified to at least about 10 mol % total of said anhydride residues with a hydroxy-functional momomer or oligomer, all or a portion of said half-esterification being with a (meth)acrylate-functional hydroxy-terminated oligomer having the formula:

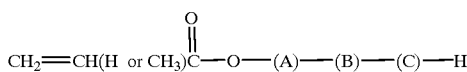

wherein (A), (B) and (C) are in any order,
(A) comprises a chain formed of between about 1 and 40, linear or branched, unsubstituted or substituted, alkoxylate monomers having between about 1 and 20 carbon atoms,
(B) is either absent or comprises a chain formed of between about 1 and 40, linear or branched, unsubstituted or substituted, alkoxylate monomers having between about 1 and 20 carbon atoms, the monomer composition of (B) being different than the monomer composition of (A), (A) plus (B) being formed from at least 2 monomers,
(C) comprises a chain formed of between about 1 and 40, linear or branched, unsubstituted or substituted, lactone monomers having between about 2 and 21 carbon atoms.

8. The photoimageable composition of claim 7, wherein:
at least about 5 mol %, up to about 100% total of said half esterification being with said (meth)acrylate-functional hydroxyl-terminated oligomer.

9. The photoimageable composition of claim 8, wherein:
said (meth)acrylate-functional hydroxyl-terminated oligomer is formed of monomers comprising (meth) acrylic acid, ethylene oxide, and epsilon-caprolactone.

10. The photoimageable composition of claim 9, wherein:
said binder polymer backbone is formed of monomers comprising maleic anhydride and styrene.

11. The photoimageable composition of claim 10, wherein:
said binder polymer has a weight average molecular weight of between about 2,000 and 200,000, and an acid number of between about 50 and 250.

12. A dry film photoresist useful in the manufacture of printed circuit boards, comprising:
a polymeric support sheet and a layer of the photoimageable composition of claim 7 thereon.

13. A binder polymer for negative-acting photoimageable compositions, comprising:
a backbone having between about 10 and 90 mol. % anhydride residues, said anhydride residues being half-esterified to at least about 10 mol % total of said anhydride residues with a hydroxy-functional momomer or oligomer, all or a portion of said half-esterification being with a (meth)acrylate-functional hydroxy-terminated oligomer having the formula:

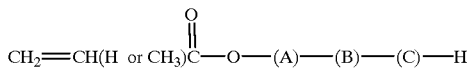

wherein (A), (B) and (C) are in any order,
(A) comprises a chain formed of between about 1 and 40, linear or branched, unsubstituted or substituted, alkoxylate monomers having between about 1 and 20 carbon atoms,
(B) is either absent or comprises a chain formed of between about 1 and 40, linear or branched, unsubstituted or substituted, alkoxylate monomers having between about 1 and 20 carbon atoms, the monomer composition of (B) being different than the monomer composition of (A), (A) plus (B) being formed from at least 2 monomers,
(C) comprises a chain formed of between about 1 and 40, linear or branched, unsubstituted or substituted, lactone monomers having between about 2 and 21 carbon atoms,
said binder polymer capable of being incorporated into an alkaline aqueous developable photoimageable composition and rendering said photoimageable composition readily strippable in alkaline aqueous stripping solutions.

14. A negative-acting photoimageable composition, comprising:
I) a binder polymer having sufficient acid functionality to render said photoimageable composition developable in alkaline aqueous solution;
II) either absent or a photopolymerizable material for said binder polymer; and,
III) a photoinitiator chemical system, wherein said binder polymer comprises a backbone having between about 10 and 90 mol. % anhydride residues, said anhydride residues being half-esterified to at least about 10 mol % total of said anhydride residues with a hydroxy-functional momomer or oligomer, all or a portion of said half-esterification being with a (meth)acrylate-functional hydroxy-terminated oligomer having the formula:

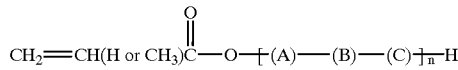

wherein (A), (B) and (C) are in any order,
n is an integer from 1 to 40,
(A) comprises a chain formed of between about 1 and 40, linear or branched, unsubstituted or substituted, alkoxylate monomers having between about 1 and 20 carbon atoms,
(B) is either absent or comprises a chain formed of between about 1 and 40, linear or branched, unsubstituted or substituted, alkoxylate monomers having between about 1 and 20 carbon atoms, the monomer composition of (B) being different than the monomer composition of (A), (A) plus (B) being formed from at least 2 monomers, and
(C) comprises a chain formed of between about 1 and 40, linear or branched, unsubstituted or substituted, lactone or lactam monomers having between about 2 and 21 carbon atoms.

15. A negative-acting photoimageable composition, comprising:
I) a binder polymer having sufficient acid functionality to render said photoimageable composition developable in alkaline aqueous solution;
II) a photopolymerizable material for said binder polymer; and,
III) a photoinitiator chemical system,
wherein the binder polymer comprises an anhydride-functional backbone, all or a portion of said backbone being half-esterified with a (meth)acrylate functional hydroxy-terminated oligomer, in which the (meth) acrylate functionality is separated from the half-ester linkage by at least two alkoxylate groups and at least one ring opened lactone or lactam group.

* * * * *